United States Patent [19]

Kitamura et al.

[11] 4,041,401
[45] Aug. 9, 1977

[54] CHANNEL INDICATING APPARATUS

[75] Inventors: Nobuo Kitamura, Sagamihara; Katsuo Takada; Hiroshi Fukagawa, both of Yokohama, all of Japan

[73] Assignee: Sony Corporation, Tokyo, Japan

[21] Appl. No.: 592,212

[22] Filed: July 1, 1975

[30] Foreign Application Priority Data

July 12, 1974 Japan ............................ 49-82527[U]

[51] Int. Cl.² ............................................. H04B 1/06
[52] U.S. Cl. ................................ 325/455; 340/378 A; 340/381
[58] Field of Search .............................. 325/455, 465; 340/378 R, 378 A, 381, 366

[56] References Cited

U.S. PATENT DOCUMENTS

| 3,503,018 | 3/1970 | Cavanagh | 325/455 X |
| 3,835,395 | 9/1974 | Smith | 325/455 X |
| 3,925,778 | 12/1975 | Wada et al. | 340/381 |

OTHER PUBLICATIONS

RCA Television Service Data, CTC 54 Series, File 1971, No. T13, 1971.

Primary Examiner—Thomas B. Habecker
Attorney, Agent, or Firm—Lewis H. Eslinger; Alvin Sinderbrand

[57] ABSTRACT

A channel selecting and indicating apparatus for a television receiver includes a plurality of channel selecting variable resistors and a cover for the channel selecting variable resistors and having a plurality of channel indicating windows. In the channel selecting and indicating apparatus, channel indicating tabs each indicating the number representing a selected channel are mounted onto the channel indicating windows from behind the cover after the channel selecting variable resistors are preset to desired channels respectively.

3 Claims, 9 Drawing Figures

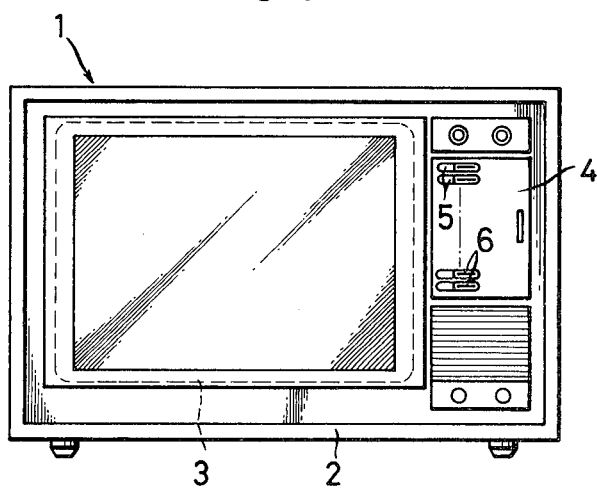
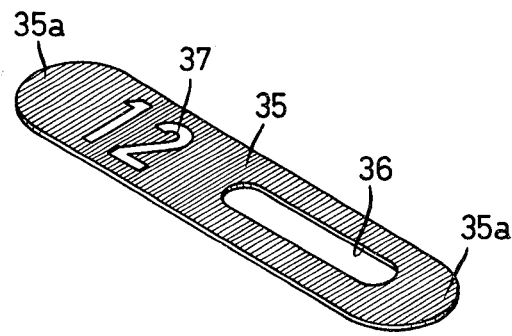

CHANNEL INDICATING APPARATUS

BACKGROUND OF THE INVENTION

1. Field of the Invention

This invention relates to a channel selecting and indicating apparatus, and more particularly to a channel selecting and indicating apparatus suitable for an electronic tuner of a television receiver.

2. Description of the Prior Art

In a conventional television receiver, the cabinet contains 12 channel selecting variable resistors for each of channels. In such a television receiver the channel selecting variable resistors can be individually preset to desired channels, depending on the area where the television receiver is used. In that case, it is necessary at the same time to indicate individually the numbers representing the selected channels In the conventional television receiver, the channel indicating member is arranged on a door covering a channel presetting apparatus provided with the channel selecting variable resistors. That is inconvenient to operate. An indicator window assembly having a plurality of windows as the channel indicating member is either fixed to the cabinet by screws, or is fitted to the cabinet. The indicator window assembly must be removed from the cabinet in order to mount channel indicating tabs indicating the numbers representing the selected channels after presetting the channel presetting apparatus. Accordingly, whenever the television receiver is preset, the door must be opened for the operation of the channel presetting apparatus, and moreover the indicator window assembly must be demounted from the cabinet. The number of operations is large. Moreover, there is the possibility that the demounted indicator window assembly may be lost. Since the indicator window assembly is separately provided, the number of parts is rather large. Such a channel indicating apparatus is expensive.

SUMMARY OF THE INVENTION

An object of this invention is to provide a channel selecting and indicating apparatus for a television receiver in which only one cover is opened in order that channel selecting variable resistors can be preset and channel indicating tabs can be mounted or exchanged, thereby reducing the number of operations and increasing efficiency of operation.

Another object of this invention is to provide a channel selecting and indicating apparatus for a television receiver in which the conventional indicator window assembly is not needed so that the number of parts can be reduced.

A further object of this invention is to provide a channel indicating apparatus for a television receiver which is simple in construction and inexpensive.

A still further object of this invention is to provide a channel indicating apparatus for a television receiver in which channel selecting buttons need not be removed from the cabinet for the presetting operation, so that the presetting operation can be efficiently performed.

A still further object of this invention is to provide a channel indicating apparatus for a television receiver in which the channel selecting buttons and the channel indicating tabs are arranged in a close relationship with each other, so that a channel can be very easily selected.

A still further object of this invention is to provide a channel indicating apparatus for a television receiver in which the channel indicating tabs can be securely and easily mounted and demounted.

A still further object of this invention is to provide a channel indicating apparatus for a television receiver in which the channel indicating tabs can be rapidly mounted and demounted without using a special tool.

A still further object of this invention is to provide a channel indicating apparatus for a television receiver in which the channel indicating tabs each correspond to a channel selecting buttons, and the channel indicating tabs can be securely positioned.

Various other objects and advantages of the invention will become clear from the following detailed description of an embodiment thereof, and the novel features will be particularly pointed out in connection with the appended claims.

In accordance with an illustrative embodiment of this invention, a channel selecting and indicating apparatus for a television receiver having a cabinet with an easily accessible control panel and tuning circuits, capable of selecting UHF as well as VHF channels, is provided to enable an operator to preset the tuning circuits to selected, predetermined channels and to select subsequently any one of these preset channels, and comprises a predetermined number of channel indicating locations on the control panel, individually adjustable variable resistors mounted in the control panel and associated with the channel indicating locations to tune a desired television channel, manually operable channel selecting switches next to each channel indicating location to permit the selection of the channel tuned by the variable resistor associated with that channel indicating location, indicators each associated with a corresponding channel indicating location to display the channel tuned by the respective variable resistor when it is activated by its associated channel selecting switch and band change-over switches, each associated with a corresponding variable resistor and operated independently of the channel indicating means to select either the VHF or UHF band for reception.

In accordance with one feature of this invention, the channel indicators include channel indicating tabs removably insertable on the control panel in association with the channel indicating locations and having translucent and opaque portions defining a channel numeral. An illuminator, such as an incandescent lamp, is arranged with each channel indicating tab to illuminate it in response to the operation of the channel selecting switch corresponding to that channel indicating location. The light passing through the translucent portions of the channel indicating tab defines the channel numeral.

In accordance with another feature of this invention, a movable cover is mounted over the control panel. The cover is provided with receptacles to permit the channel indicating tabs to be attached to the back portion of the cover.

BRIEF DESCRIPTION OF THE DRAWINGS

FIG. 1 is a front view of a television receiver including a channel selecting and indicating apparatus according to one embodiment of this invention;

FIG. 4 is a perspective view of a channel indicating tab employed for the channel selecting and indicating apparatus;

DESCRIPTION OF THE PREFERRED EMBODIMENTS

Figure 2:
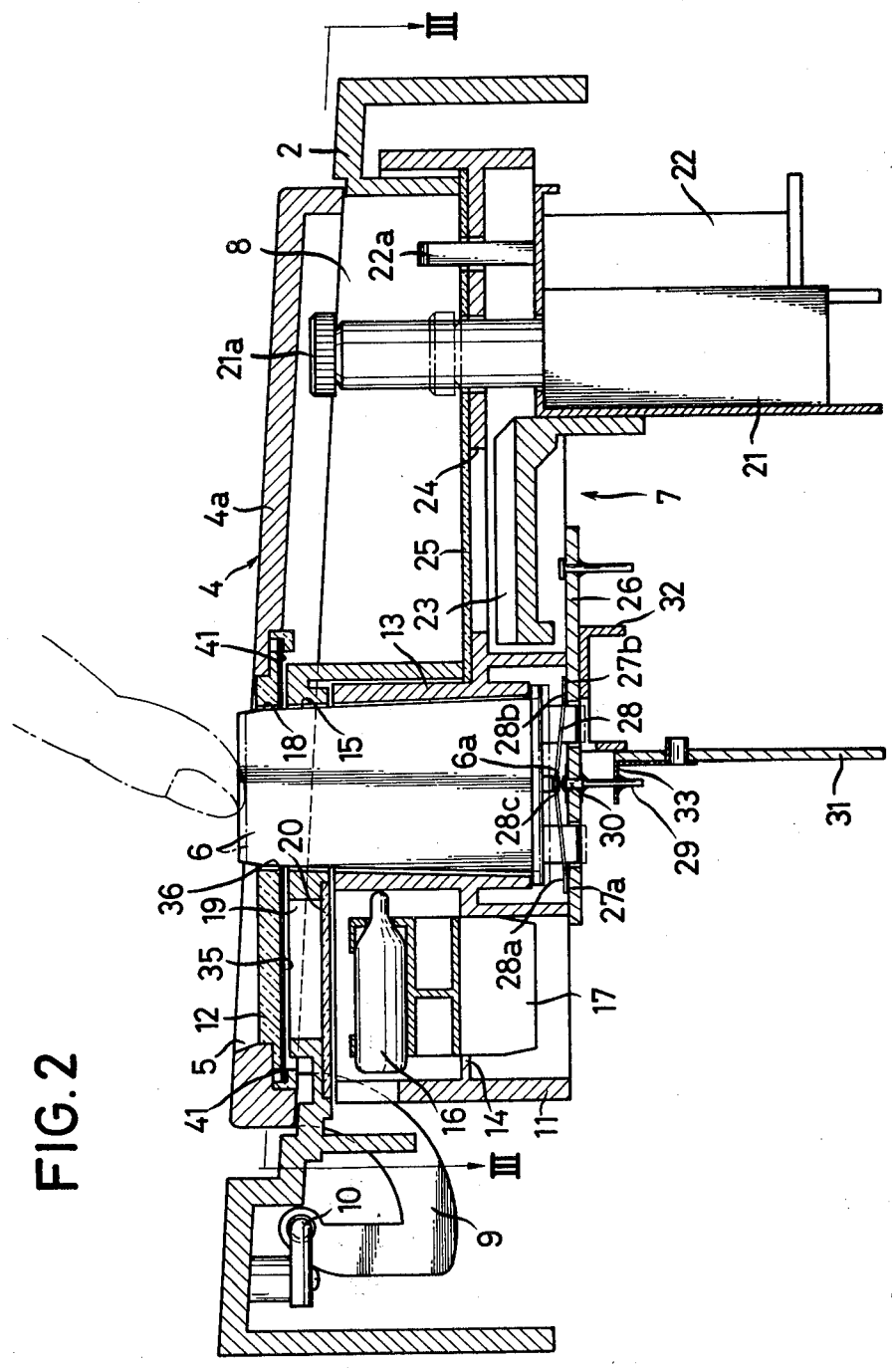
FIG. 2 is an enlarged cross-sectional view of a channel selecting and indicating apparatus.

FIG. 1 shows a front view of a television receiver 1 according to one embodiment of this invention. A cover 4 covering a control panel for a channel selecting and indicating apparatus hereinafter described is arranged next to cathod ray tube 3 in the television receiver 1. In the left side of the cover 4 a column of indicating windows 5 are provided, corresponding individual receiving channels. These channel indicating windows 5 are formed as oblong holes. Top portions of individual channel selecting buttons 6 extend outwardly of the channel indicating windows 5, respectively.

Figure 3:
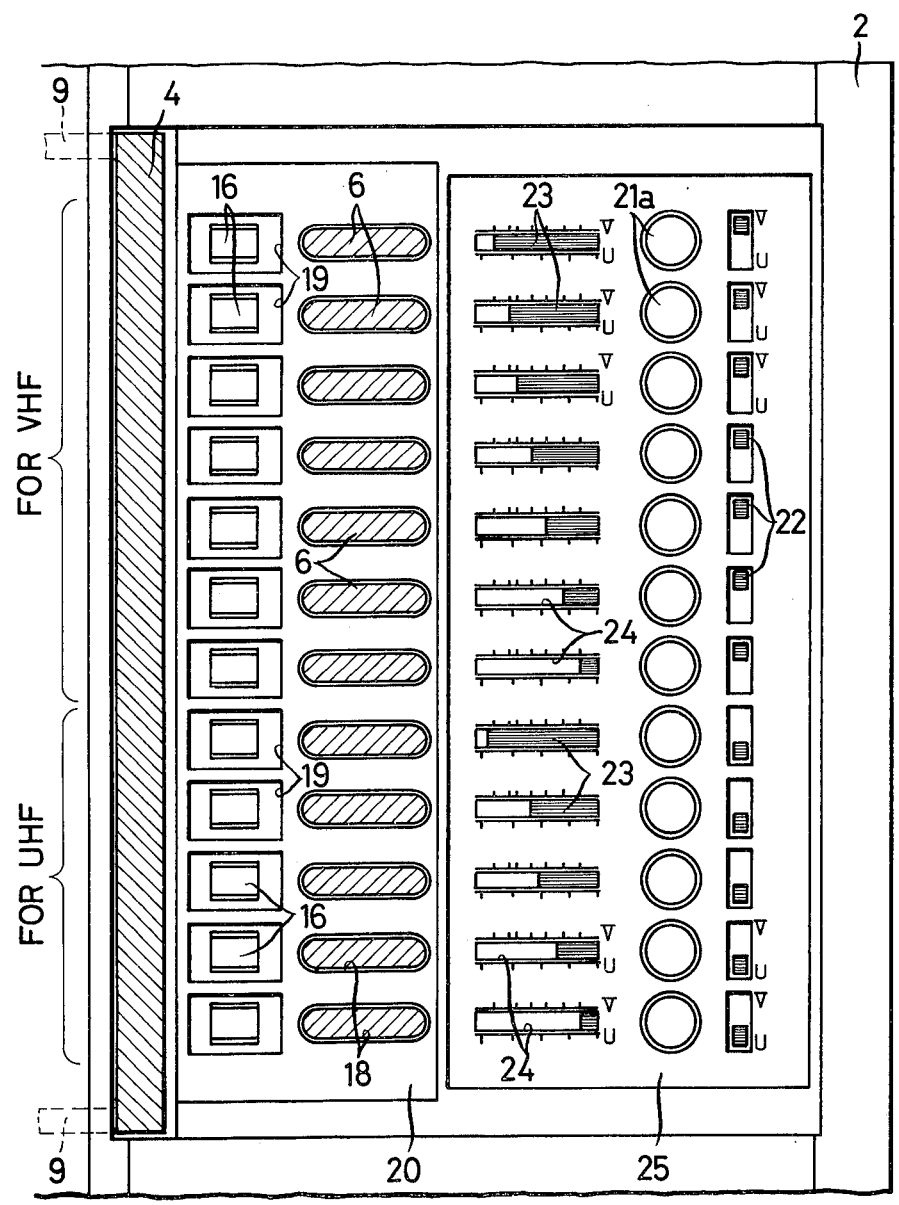
FIG. 3 is a cross-sectional view taken along the line III—III of FIG. 2.

FIG. 2 and FIG. 3 show details of a channel selecting and indicating apparatus 7. A chassis 11 for the channel selecting and indicating apparatus is mounted behind a concaved portion 8 made in the cabinet 2. The cover 4 is mounted on the cabinet 2 so as to close the concave portion 8 with a solid portion 4a of the cover 4 which is adjacent the channel indicating windows 5. The cover 4 has a pair of arcuate arms 9 attached at the upper and lower ends of one edge of the cover 4. The arcuate arms 9 are inserted into the cabinet 2. Top ends of the arcuate arms 9 are pivoted to supporting pins 10 fixed on the cabinet 2, respectively. Thus, the cover 4 is mounted rotatably round the supporting pins 10. The cover 4 is normally urged so as to close the concaved portion 8, by a restoring spring (not shown). The cover 4 may be formed of ABS resin or styrene resin. A style strip 12 formed of transparent material is fixed by adhesive, or is fitted to the row of the channel indicating windows 5 at the reverse side of the cover 4.

The chassis 11 for the channel selecting and indicating apparatus may be formed of ABS resin or styrene resin. Button holding portions 13 and lamp holding portions 14 are formed in the chassis 11, corresponding to each of the channel indicating windows 5. The channel selecting buttons 6 are held slidably in the button holding portions 13, respectively. The channel selecting buttons 6 pass through apertures 15 made in the cabinet 2 and through apertures 18 made in the style strip 12, and project from the cover 4 by a predetermined length. Illuminating lamps 16 such as Neon tubes or miniature bulbs are held in the respective lamp holding portions 14 by lamp holders 17, respectively. Each of the illuminating lamps 16 when energized illuminates its respective channel indicating windows 5 through aperture 19 made in the cabinet 2. A guarding plate 20 which may be formed of transparent acryl resin is fixed in front of lamp 16.

Channel selecting variable resistors 21, band change-over (VHF/UHF) switches 22 and coarse channel indicators 23 are arranged in the chassis 11 in rows, accessible through the concave portion 8. The channel selecting button 6, the channel selecting variable resistor 21, the band change-over switch 22 and the coarse channel indicator 23 are aligned with each other (FIG. 3) to comprise, generally, a tuning location. Tuning knobs 21a of the channel selecting variable resistors 21 and change-over knobs 22a of the band change-over switches 22 project into the concave portion 8. The coarse channel indicators 23 are arranged behind opening 24 in the chassis 11. A style strip 25 which may be formed of transparent acryl resin is fixed on the bottom of the concaved portion 8. A switch board 26 is fixed on the chassis 11 behind the channel selecting buttons 6. A pair of common conductive patterns 27a and 27b is formed on the switch board 26. An inverted V-shaped conductive spring contact 28 is arranged behind each of the respective channel selecting buttons 6. Opposite ends 28a and 28b of the conductive spring contacts 28 are attached respectively to the common conductive patterns 27a and 27b. Central portions 28c of the spring contacts 28 elastically contact the bottom 6a of the respective channel selecting buttons 6, and oppose respective rivet contacts 29 fixed on the switch board 26. The rivet contacts 29 may be soldered to conductive patterns 30 independently of each other in the switch board 26. Each of the spring contacts 28 functions as a movable contact and each of the rivet contacts 29 functions as a stationary contact, for the associated button 6. A main printed board 31 is fixed to the switch board 26 through a supporting member 32. The rivet contacts 29 are connected to predetermined circuits on the main printed board 31 through connecting members 33, respectively.

Channel indicating tabs 35 are removably mounted on the respective channel indicating windows 5 of the cover 4 from behind, as viewed in FIGS. 1 and 2. The channel indicating tabs 35 are provided with apertures 36 through which the buttons 6 pass.

In one illustrative application of this apparatus, as embodied in FIG. 3, a first group of tuning locations comprised of buttons 6, lamps 16, channel selecting variable resistors 21, band change-over switches 22, and rough channel indicators 23 may be used to select and indicate VHF channels, and a second group of tuning locations may be used to select and indicate UHF channels.

In operation, each of the channel selecting variable resistors 21 is preset to a desired channel. The number on a channel indicating tab disposed at the tuning location with which the variable resister is associated, thus representing the preset channel, is indicated through the corresponding channel indicating window 5. The corresponding band change-over switch 22 at the tuning location is suitably operated to select the VHF or the UHF band. In the presetting operation, the knob 21a of the variable resistor 21 is pulled up from its lower position (shown by the broken line) to its upper position (shown by the solid line in FIG. 2). The knob 21a then is rotated to tune the receiver to a selected frequency, or channel, while the corresponding coarse channel indicator 23 may be observed. After the presetting operation, the knob 21a of the channel selecting variable resistor 21 is depressed to its lower position, shown by the broken line in FIG. 2.

For selecting any one of the preset channels, the button 6 at a desired tuning location is manually pushed against the spring contact 28 to contact the central portion 28c of the spring contact 28 with the rivet contact 29. Thus, the channel selection switch constituted by the spring contact 28 and the rivet contact 29 is turned on and the corresponding lamp 16 is lighted. The channel indicating tab 35 is illuminated at the channel indicating window 5 in this tuning location, so that it indicates the number representing the selected channel. Even though the operator's finger is removed from the button 6, which then is restored to its original position by the spring contact 28 to separate the spring contact 28 from the rivet contact 29, thereby turning off the channel selection switch, the state of the channel selection is electrically maintained and the corresponding lamp 16 is not turned off. However, when another button 6 is pushed to select another channel, the previous channel selection is released, and the previously energized lamp 16 is turned off. At the same time, the new is turned on channel selection switch is turned on and corresponding lamp 16 is turned on.

Next, apparatus for mounting the channel indicating tab 35 onto the channel indicating window 5 will be described with reference to FIG. 4 – FIG. 9.

As is apparent from FIG. 4, both ends of the channel indicating tab 35 preferably are rounded however, the ends may be squared if desired. The channel indicating tab 35 may be is formed of an elastic film material 0.5 mm thick, such as ABS resin or Mylar resin. Preferably this channel indicating tab 35 is opaque. However, the portion defining a channel number 37 is translucent or transparent. An oblong aperture 36 is formed adjacent the number 37 in the channel indicating tab 35. Although the ends of tab 35 may be rounded or squared, it is easier to mount the channel indicating tab 35 in window 5 if it has rounded ends rather than square ends, as described below.

Figure 5:
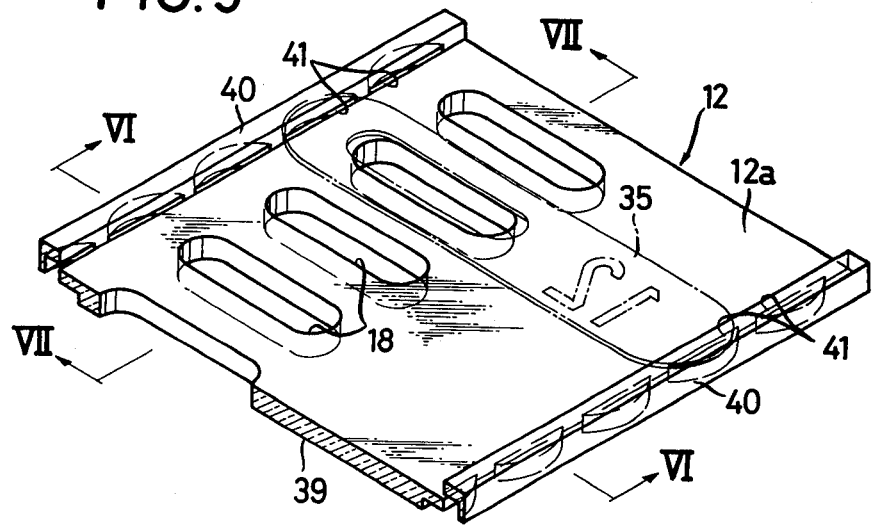
FIG. 5 is a perspective view of the reverse side of a style strip employed for the channel selecting and indicating apparatus.
Figure 6:
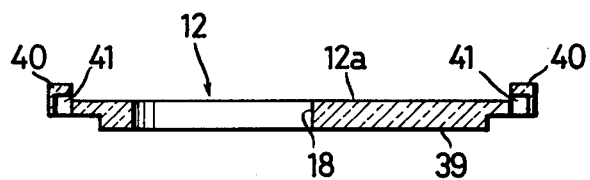
FIG. 6 is a cross-sectional view taken along the line VI—VI of FIG. 5.
Figure 7:
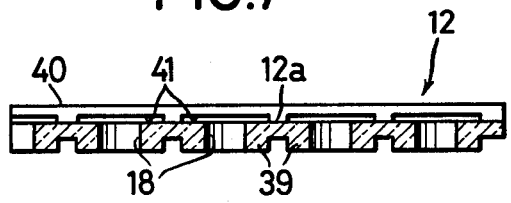
FIG. 7 is a cross-sectional view taken along the line VII—VII of FIG. 5.
Figure 9:
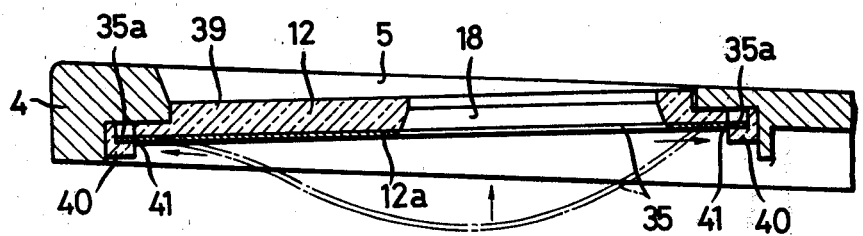
FIG. 9 is a cross-sectional view of a part of the channel selecting and indicating apparatus.

As apparent from FIG. 5 – FIG. 7, ridges 39 are formed integrally with the transparent style strip 12. The style strip 12 is mounted on the reverse side of the cover 4 in such a manner that the ridges 39 are fitted into the channel indicating windows 5, respectively (FIG. 9). The aforementioned apertures 18 are formed in the ridges 39. A pair of angle members 40 is formed integrally with the style strip 12 along the longitudinal edges of the latter. Pairs of fitting slits 41 opposite to each other are formed in the angle members 40 in a plane with a reverse side 12a of the style strip 12. The angle members 40 are arcuately cut out to form the fitting slits 41, corresponding to arcuate ends 35a of the channel indicating tab 35.

In a typical channel presetting operation, when an operator presets one of the variable resistors 21 to select a desired channel, the appropriate channel indicating tab 35 identifying the selected channel will be positioned in the channel indicating window 5 at the corresponding tuning location. In order to perform the presetting operation, the cover 4 should be opened to expose the concaved portion 8. This permits the knobs 21a and 22a, and therefore the channel selecting resistor 21 and the band change-over switch 22 to be operated. Also, the opened cover enables the channel indicating tab 35 to be properly inserted after the presetting operation.

Figure 8:
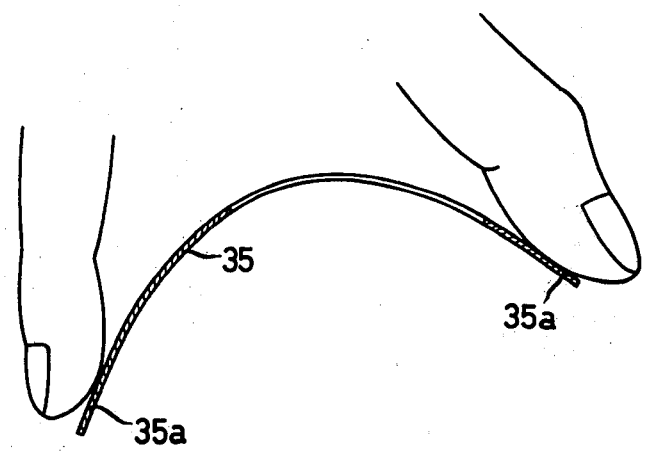
FIG. 8 is a cross-sectional view of the channel indicating tab curved to be mounted.

When the channel indicating tab 35 bearing the number representing the selected channel is mounted onto the channel indicating window 5 in the corresponding tuning location, both ends 35a of the channel indicating tab 35 are pinched by the thumb and the forefinger so that the channel indicating tab 35 is bent as shown on FIG. 8.

The bent channel indicating tab 35 is applied to the predetermined position on the reverse side 12a of the style strip 12, and both of its ends 35a are fitted into the fitting slits 41, thus becoming flat, as shown on FIG. 9. The channel indicating tab 35 is now in contact close with the reverse side, 12a of the style strip 12, and is held in position by the pair of fitting slits 41. The aperture 36 of the channel indicating tab 35 overlaps the aperture 18 of the style strip 12 behind the channel indicating window 5.

The channel indicating tab 35 is removed from the style strip 12 by reversing the order of the above-mentioned inserting operation. Both ends 35a of the channel indicating tab 35 are pinched by the thumb and the forefinger to bend the channel indicating plate 35 and then it is removed from the fitting slits 41.

Although one embodiment of this invention has been described above, further modifications are possible within the scope of this invention.

For example, material, shape and construction of the channel indicating tab 35 may be varied. Although the channel indicating tab 35 is mounted on the style strip 12 attached to the reverse side of the cover 4 in the above-mentioned embodiment, the channel indicating tab 35 can be designed to be mounted directly on the reverse side of the cover 4.

Moreover, the shape and construction of the cover 4, and the construction for mounting the channel indicating tab 35 may be varied. Although the cover 4 is hinged in the above mentioned embodiment, it may be designed to be slidable.

What is claimed is:

1. A channel selecting and indicating apparatus for a television receiver having a cabinet provided with a control panel, said apparatus cooperating with tuner means included in said television receiver to enable an operator to preset said tuner means to selected, predetermined channels and to subsequently select any one of said preset channels, comprising: a predetermined number of channel indicating locations on said control panel; a plurality of individually adjustable variable resistors mounted in said control panel, each said variable resistors being associated with a corresponding one of said channel indicating locations and accessible by said operator to preset said tuner means to a desired one of said channels; a plurality of manually operable channel selecting switches, each switch being associated with a corresponding one of said channel indicating locations and mounted on said control panel to be selectively manually operated for tuning said tuner means to the one channel preset by said variable resistor associated with said one channel indicating location; a plurality of illuminating means disposed at said channel indicating locations, each being energized when an associated channel selecting switch at said channel indicating location is operated; a moveable cover mounted over said control panel, said moveable cover having a front side and a reverse side; a plurality of channel indicating tabs mounted on the reverse side of said moveable cover, each of said tabs being mounted at a position on said cover such that when said cover is closed over said control panel, each of said tabs is positioned over a corresponding one of said illuminating means, each of said tabs having portions of differing light transmissivity to define a channel numeral, whereby the particular channel numeral defined by the corresponding channel indicating tab is illuminated when the associated channel selecting switch at said channel indicating location is operated to energize its associated illuminating means; and a plurality of manually operable band change-over switches separate from and independent of said channel indicating tabs, each of said band change-over switches being associated with a corresponding channel indicating location and a corresponding one of said variable resistors for selecting the desired frequency band of operation of said tuner means in response to a manual activation thereof.

2. A channel selecting and indicating apparatus according to claim 1, wherein said moveable cover is provided with a plurality of apertures through which said channel selecting switches protrude.

3. A channel selecting and indicating apparatus according to claim 1, wherein said channel indicating tabs are each provided with an aperture through which the corresponding channel selecting switch protrudes.